(12) United States Patent
Sakamoto et al.

(10) Patent No.: US 11,187,974 B2
(45) Date of Patent: Nov. 30, 2021

(54) PHOTOMASK BLANK, PHOTOMASK, AND PHOTOMASK MANUFACTURING METHOD

(71) Applicant: TOPPAN PRINTING CO., LTD., Tokyo (JP)

(72) Inventors: Yoshifumi Sakamoto, Tokyo (JP); Yosuke Kojima, Tokyo (JP); Tatsuya Nagatomo, Tokyo (JP)

(73) Assignee: TOPPAN PRINTING CO., LTD., Tokyo (JP)

( * ) Notice: Subject to any disclaimer, the term of this patent is extended or adjusted under 35 U.S.C. 154(b) by 122 days.

(21) Appl. No.: 16/578,938

(22) Filed: Sep. 23, 2019

(65) Prior Publication Data

US 2020/0012185 A1  Jan. 9, 2020

Related U.S. Application Data

(63) Continuation of application No. PCT/JP2018/014059, filed on Apr. 2, 2018.

(30) Foreign Application Priority Data

Apr. 3, 2017  (JP) .............................. JP2017-073498

(51) Int. Cl.
*G03F 1/32* (2012.01)

(52) U.S. Cl.
CPC ...................... *G03F 1/32* (2013.01)

(58) Field of Classification Search
CPC ........................................................ G03F 1/32
USPC ............................................................. 430/5
See application file for complete search history.

(56) References Cited

U.S. PATENT DOCUMENTS

| | | | |
|---|---|---|---|
| 9,366,951 B2 * | 6/2016 | Inazuki | ............ G03F 1/26 |
| 2003/0203286 A1 | 10/2003 | Maeshima et al. | |
| 2004/0086788 A1 | 5/2004 | Shiota et al. | |
| 2010/0092874 A1 | 4/2010 | Nozawa et al. | |
| 2011/0171567 A1 | 7/2011 | Nozawa et al. | |
| 2012/0251929 A1 | 10/2012 | Nozawa et al. | |
| 2015/0125785 A1 | 5/2015 | Inazuki et al. | |
| 2016/0033858 A1 | 2/2016 | Kosaka et al. | |
| 2016/0291456 A1 | 10/2016 | Kosaka et al. | |
| 2017/0059983 A1 | 3/2017 | Kosaka | |

FOREIGN PATENT DOCUMENTS

| | | |
|---|---|---|
| EP | 2 871 520 A2 | 5/2015 |
| JP | 2003-322948 A | 11/2003 |
| JP | 2003-322952 A | 11/2003 |
| JP | 2010-009038 A | 1/2010 |
| JP | 2015-062050 A | 4/2015 |
| JP | 2015-111246 A | 6/2015 |
| JP | 2016-035559 A | 3/2016 |
| JP | 2016-191882 A | 11/2016 |
| JP | 2017-049573 A | 3/2017 |

OTHER PUBLICATIONS

Extended European Search Report dated Dec. 15, 2020 for corresponding European Patent Application No. 18781333.2.
International Search Report of PCT/JP2018/014059 dated Jun. 12, 2018 with English translation thereof, and the Written Opinion of ISA in Japanese language (13 pages).

* cited by examiner

*Primary Examiner* — Christopher G Young
(74) *Attorney, Agent, or Firm* — Foley & Lardner LLP

(57) ABSTRACT

A photomask blank and a photomask having favorable wafer transfer characteristics and irradiation resistance. A photomask blank is for fabricating a photomask for an exposure wavelength of 193 nm, the photomask blank comprising: a light-transmissive substrate; a phase shift film formed on the light-transmissive substrate and providing phase shift effects of a light transmittance of at least 30% with respect to exposure light; and a light-shielding film formed on the phase shift film. The phase shift film is constituted by lamination of: a first phase shift film (that uses a silicon nitride-based material, has a refractive index n1 of 2.5 to 2.7, and an extinction coefficient k1 of 0.2 to 0.4; and a second phase shift film that uses a silicon oxynitride-based material, has a refractive index n2 of 1.55 to 2.20, and an extinction coefficient k2 greater than 0 but no greater than 0.1.

10 Claims, 14 Drawing Sheets

Fig. 11

| Film thickness of second phase shift film [nm] \ Film thickness of first phase shift film [nm] | 5 | 10 | 15 | 20 | 25 | 30 | 35 | 40 | 45 | 50 | 55 | 60 | 65 |
|---|---|---|---|---|---|---|---|---|---|---|---|---|---|
| 20 | 1.43 | 1.47 | 1.52 | 1.57 | 1.65 | 1.78 | 2.01 | 1.98 | 2.01 | 2.23 | 2.12 | 1.99 | 1.95 |
| 30 | 1.47 | 1.52 | 1.61 | 1.65 | 1.78 | 1.88 | 2.10 | 2.09 | 2.19 | 2.07 | 2.03 | 1.92 | 1.71 |
| 40 | 1.56 | 1.61 | 1.66 | 1.73 | 2.07 | 2.03 | 2.18 | 2.19 | 2.05 | 1.94 | 1.92 | 1.75 | 1.65 |
| 50 | 1.67 | 1.70 | 1.73 | 1.83 | 2.10 | 2.11 | 2.03 | 1.98 | 1.94 | 1.84 | 1.78 | 1.71 | 1.60 |
| 60 | 1.75 | 1.74 | 1.97 | 1.98 | 2.13 | 2.06 | 2.06 | 1.93 | 1.87 | 1.72 | 1.71 | 1.61 | 1.53 |
| 70 | 1.77 | 1.90 | 2.09 | 2.01 | 2.01 | 2.01 | 1.91 | 1.82 | 1.67 | 1.57 | 1.63 | 1.52 | 1.47 |
| 80 | 1.83 | 2.04 | 2.19 | 1.93 | 1.91 | 1.86 | 1.81 | 1.71 | 1.54 | 1.51 | 1.49 | 1.47 | 1.39 |

NILS is improved from comparative example

Fig. 13

NILS IS IMPROVED FROM COMPARATIVE EXAMPLE

| Film thickness of second phase shift film [nm] | Film thickness of first phase shift film [nm] | | | | | | | | | | | | |
|---|---|---|---|---|---|---|---|---|---|---|---|---|---|
| | 5 | 10 | 15 | 20 | 25 | 30 | 35 | 40 | 45 | 50 | 55 | 60 | 65 |
| 20 | 1.35 | 1.39 | 1.45 | 1.50 | 1.60 | 1.73 | 1.97 | 1.93 | 1.97 | 2.17 | 2.01 | 1.93 | 1.88 |
| 30 | 1.39 | 1.44 | 1.56 | 1.58 | 1.60 | 1.94 | 2.05 | 2.05 | 2.13 | 2.01 | 1.88 | 1.87 | 1.63 |
| 40 | 1.49 | 1.52 | 1.61 | 1.66 | 1.72 | 1.97 | 2.10 | 2.15 | 1.90 | 1.88 | 1.87 | 1.69 | 1.59 |
| 50 | 1.59 | 1.64 | 1.67 | 1.81 | 2.01 | 2.06 | 1.96 | 1.95 | 1.87 | 1.80 | 1.72 | 1.65 | 1.54 |
| 60 | 1.68 | 1.69 | 1.89 | 1.91 | 2.04 | 2.00 | 2.00 | 1.88 | 1.80 | 1.71 | 1.65 | 1.55 | 1.46 |
| 70 | 1.88 | 1.82 | 2.01 | 1.96 | 2.00 | 1.95 | 1.86 | 1.81 | 1.63 | 1.51 | 1.56 | 1.45 | 1.42 |
| 80 | 1.80 | 1.97 | 2.10 | 1.87 | 1.85 | 1.80 | 1.80 | 1.64 | 1.49 | 1.45 | 1.42 | 1.39 | 1.31 |

PHOTOMASK BLANK, PHOTOMASK, AND PHOTOMASK MANUFACTURING METHOD

CROSS-REFERENCE TO RELATED APPLICATIONS

The present application is a continuation application of International Application No. PCT/JP2018/014059, filed Apr. 2, 2018, which claims priority to Japanese Patent Application No. 2017-073498, filed Apr. 3, 2017, the contents of all of these applications are incorporated herein by reference in their entirety.

TECHNICAL FIELD

The present invention relates to a photomask blank, a photomask and a photomask manufacturing method used for fabricating semiconductor devices and so on.

BACKGROUND ART

As a technique for forming a fine pattern image on a resist material, a photomask manufacturing device and manufacturing method is known where an original pattern is drawn on a photomask blank coated with a photoresist, which is subjected to heat treatment after exposure and developed thereafter to fabricate a resist pattern. Then, a light shielding film and a phase shift film are etched using the resist pattern as a mask. The light shielding film is, for example, a film formed by adding oxygen, nitrogen or carbon to a chromium film, and the phase shift film is, for example, a film formed by adding a transition metal such as molybdenum to silicon, nitrogen or oxygen.

Recently, along with the high integration of LSI, an exposure light source used for manufacturing semiconductor devices uses shorter wavelength of light from KrF excimer laser (wavelength of 248 nm) to ArF excimer laser (wavelength of 193 nm).

Based on a relational expression E=hc/λ between light energy E and wavelength λ (wherein h represents Planck's constant and c represents velocity of light), shortening of wavelength of light source means increase of energy per one photon. From the viewpoint of state of energy, it means that the photomask is exposed to a state where chemical reaction is more likely to occur, and therefore, a phenomenon has occurred that has not been an issue in the step of manufacturing a wafer using an exposure wavelength of 248 nm.

Especially, one of the problems is the variation of mask pattern dimension during exposure. Along with the increase in accumulated amount of exposure irradiated to a line-based pattern on the mask, oxidation of the mask pattern has caused the dimension of the line-based pattern to be enlarged, and the impact that the variation of dimension provides on the manufacturing processes of leading-edge wafers has become significant.

Further, in a process of manufacturing leading-edge wafers, in order to improve wafer transfer characteristics, a mainstream phase shift mask has a phase difference between an ArF excimer laser beam transmitted through a light-transmissive substrate and an ArF excimer laser beam transmitted through both the light-transmissive substrate and the phase shift film (hereinafter simply referred to as "phase difference") of between 170 through 190 degrees and a light transmittance of 6%. If the light transmittance of the phase shift film on the phase shift mask is 6%, a most favorable wafer transfer characteristics is achieved where the phase difference is around 180 degrees.

In a state of forming a phase shift film dry-etched using a fluorine-based gas where the film thickness of the phase shift film is set to have a phase difference of around 177 degrees, a method of processing the light-transmissive substrate for about 3 nm simultaneously to realize a final phase difference of around 180 degrees is known.

Normalized Image Log Slope (NILS) that represents a slope of contrast of optical energy distribution that passes through the photomask to form a pattern image on the wafer resist, Depth of Focus (DOF) that represents a distance from a focus capable of forming the pattern stably, Mask Error Enhancement Factor (MEEF) that represents a degree of error of dimension on the mask being amplified on the wafer dimension, and a bias (Electro Magnetic Field Bias: EMF bias) related to an electromagnetic field effect in the mask pattern, are used as items for expressing wafer transfer characteristics.

In 14-nm or finer generation of logic devices or in 20-nm or finer generation of memory devices, transmittance of 6% is not sufficient, so a high-transmittance phase shift mask is gathering attention.

By increasing the light transmittance, the phase shift effect is further enhanced, and favorable wafer transfer characteristics can be achieved.

In 14-nm or finer generation of logic devices or in 20-nm or finer generation of memory devices, the dimension of the pattern on the wafer is required to be even finer, and a high transmittance phase shift mask having a light transmittance of 20% or higher is desired to obtain higher wafer transfer characteristics.

However, the phase shift film thickness must be increased to realize higher light transmittance while maintaining the phase difference of the phase shift film to around 177 degrees.

Further, along with the refinement of the photomask, a fine assist pattern is required, but a problem occurs in a cleaning step for removing foreign substances in which the assist pattern is collapsed and lost by the impact caused by cleaning fluid or rinse fluid. This problem is caused by the increased thickness of the phase shift film, and in order to improve durability against cleaning, the film thickness of the phase shift film must be reduced.

At the same time, a phase shift film that is as thin as possible is preferred, since the thinner the film thickness of the phase shift film is, the better the EMF bias is.

A silicon nitride film having eliminated transition metal such as molybdenum from the phase shift film is drawing attention, since it has high light transmittance of the phase shift film, so that good wafer transfer characteristics (NILS, DOF, MEEF, EMF bias) can be realized and pattern variation by exposure is reduced.

CITATION LIST

Patent Literature

[JPL1] Japanese Patent Application Laid-Open Publication No. 2010-9038
[JPL2] Japanese Patent Application Laid-Open Publication No. 2016-191882

SUMMARY OF INVENTION

Technical Problem

In 14-nm or finer generation of logic devices, double exposure or quadruplex exposure are performed during the wafer manufacturing process, so that there is a need to minimize the variation of mask dimension during wafer exposure. In contrast, in order to improve irradiation resistance, a prior art halftone-type phase shift mask forms a phase shift film mainly using silicon nitride and reducing the content of transition metal such as molybdenum. (JPL1 and JPL2).

Further, in order to realize favorable wafer transfer characteristics (NILS, DOF, MEEF, EMF bias) during the wafer manufacturing process, the light transmittance of the phase shift film is required to be 6% or higher. (JPL1 and JPL2)

Further, along with the refinement of the photomask, a fine assist pattern is required, so that a phase shift film having a small film thickness is preferable to reduce the influence of the cleaning fluid on the pattern during the cleaning step of the photomask. (JPL1 and JPL2)

However, according the method disclosed in JPL1 or JPL2, the light transmittance of the phase shift film is respectively 9% or more and 30% or less (JPL1) or 3% or more and 12% or less (JPL2), and it is difficult to correspond to high transmittance that is required in leading-edge photomasks.

In order to increase the light transmittance by adding nitrogen or oxygen gas, it is necessary to increase the film thickness of the phase shift film to maintain a phase difference of around 177 degrees, and the possibility of collapsing of the pattern during cleaning is increased.

Further, silicon nitride is effective in increasing the light transmittance while suppressing the film thickness of the phase shift film to a minimum and maintaining a phase difference around 177 degrees, but in a monolayer film of silicon nitride, the light transmittance cannot be increased higher than 18%.

The present invention aims at improving or even solving the problems described above, and the object thereof is to provide a photomask blank, a photomask and a photomask manufacturing method that adopts a phase shift film as thin as possible, that has favorable wafer transfer characteristics (NILS, DOF, MEEF and EMF bias) and enables to ensure both irradiation resistance and pattern collapse resistance during cleaning.

Solution to Problem

A photomask blank according to one aspect of the present invention relates to a photomask blank used for fabricating a photomask to which an exposure light with a wavelength of 193 nm is applied, the photomask blank including a light-transmissive substrate, a phase shift film formed on the light-transmissive substrate and providing a phase shift effect, and a light shielding film formed on the phase shift film. The phase shift film is composed by laminating a first phase shift film using a silicon nitride-based material, and a second phase shift film using a silicon oxynitride-based material. Further, the phase shift film has a light transmittance of 30% or more with respect to the exposure light, the first phase shift film has a refractive index $n_1$ of 2.5 or more and 2.75 or less, the second phase shift film has a refractive index $n_2$ of 1.55 or more and 2.20 or less, the first phase shift film has an extinction coefficient $k_1$ of 0.2 or more and 0.4 or less, and the second phase shift film has an extinction coefficient $k_2$ that is greater than 0 and no greater than 0.1.

According further to the photomask blank, a film thickness $D_1$ of the first phase shift film and a film thickness $D_2$ of the second phase shift film should preferably satisfy the following relationship:

$$D_1(nm) > -0.5 \cdot D_2(nm) + 45 \text{ nm, and}$$

$$D_1(nm) < -0.5 \cdot D_2(nm) + 75 \text{ nm.}$$

Further according to the photomask blank, the light shielding film should preferably not be etched by fluorine-based dry etching and be etched by oxygen-containing chlorine-based dry etching and should preferably have a chromium content of 20 atomic % or more.

A photomask according to one aspect of the present invention relates to a photomask to which an exposure light with a wavelength of 193 nm is applied, the photomask including a light-transmissive substrate, and a circuit pattern which is a pattern formed on a phase shift film laminated on the light-transmissive substrate. The phase shift film is composed by laminating a first phase shift film using a silicon nitride-based material, and a second phase shift film using a silicon oxynitride-based material. Further, the phase shift film has a light transmittance of 30% or more with respect to the exposure light, the first phase shift film has a refractive index $n_1$ of 2.5 or more and 2.75 or less, the second phase shift film has a refractive index $n_2$ of 1.55 or more and 2.20 or less, the first phase shift film has an extinction coefficient $k_1$ of 0.2 or more and 0.4 or less, and the second phase shift film has an extinction coefficient $k_2$ that is greater than 0 and no greater than 0.1.

According to this photomask, a film thickness $D_1$ of the first phase shift film and a film thickness $D_2$ of the second phase shift film should preferably satisfy the following relationship:

$$D_1(nm) > -0.5 \cdot D_2(nm) + 45 \text{ nm, and}$$

$$D_1(nm) < -0.5 \cdot D_2(nm) + 75 \text{ nm.}$$

According to this photomask, a light shielding film should preferably be laminated on the phase shift film positioned at a periphery portion of an effective area including the circuit pattern, and the light shielding film should preferably be mainly composed of chromium that may not substantially be etched by fluorine-based dry etching but can be etched by oxygen-containing chlorine-based dry etching.

Further, a photomask manufacturing method according to one aspect of the present invention relates to a photomask manufacturing method using the above-described photomask blank, the method including a step of forming a pattern on the light shielding film by performing dry etching using an oxygen-containing chlorine-based gas to the light shielding film, a step of forming a circuit pattern and a periphery portion pattern that forms a periphery portion of an area including the circuit pattern on the phase shift film by performing dry etching using a fluorine-based gas to the phase shift film using the pattern formed on the light shielding film as a mask, a step of forming a resist pattern on the periphery portion pattern, and performing dry etching using an oxygen-containing chlorine-based gas using the resist pattern as a mask to remove a portion of the light shielding film, and a step of removing the resist pattern.

Advantageous Effects of Invention

According to the present invention, it becomes possible to realize a photomask blank or a photomask having a good irradiation resistance while ensuring wafer transfer characteristics.

BRIEF DESCRIPTION OF DRAWINGS

FIG. 11 is a view illustrating a relationship between film thickness $D_1$ of a first phase shift film and a second phase shift film $D_2$, and NILS.

FIG. 13 is a view illustrating a relationship between film thickness $D_1$ of the first phase shift film and film thickness $D_2$ of the second phase shift film, and NILS.

DESCRIPTION OF REPRESENTATIVE EMBODIMENTS

Figure 1:
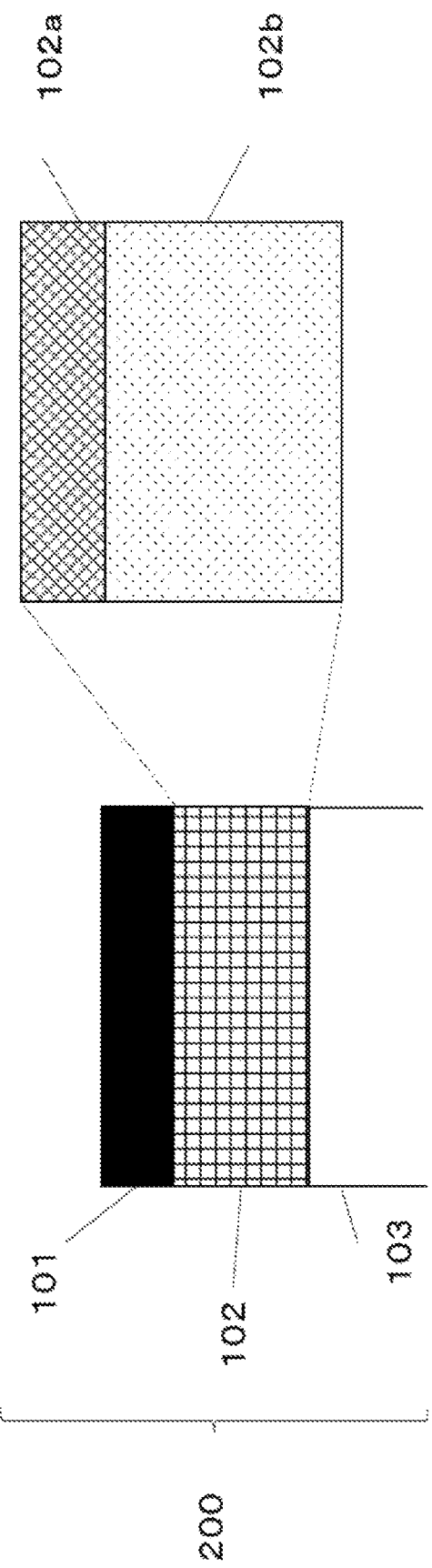
FIG. 1 is a schematic cross-sectional view illustrating a configuration of a photomask blank according to a first embodiment.

With reference to the accompanying Figures, a description will now be given of representative embodiments according to the present invention. The present invention is not limited to the following representative embodiments, and appropriate modifications can be made without departing from the spirit of the present invention. The representative embodiments described below are merely examples of the present invention, and the design thereof could be appropriately changed by one skilled in the art. Here, the drawings are schematic, and the relationship between thickness and plane size, the ratio of the thickness of each layer, etc., are different from actual ones. The embodiments described below are merely examples of the configurations for embodying the technical idea of the present invention, and the technical idea of the present invention should not limit the materials, shapes, structures, and the like of the components to those described below. The technical idea of the present invention can be modified in various ways within the technical scope specified by the claims. The same constituent elements are denoted by the same reference numerals unless there is a reason for the sake of convenience, and redundant description is omitted. In the drawings referred to in the following description, for clarity, characteristic parts are enlarged, and thus the components are not shown to scale. It is, however, clear that one or more embodiments can be implemented without such details. In addition, known structures and devices may be schematically represented for simplicity. The drawings referred to in the description may show characteristic portions in enlarged views to help understand the characteristics, and dimensions of the respective components do not necessarily correspond to the actual dimensions.

Figure 2:
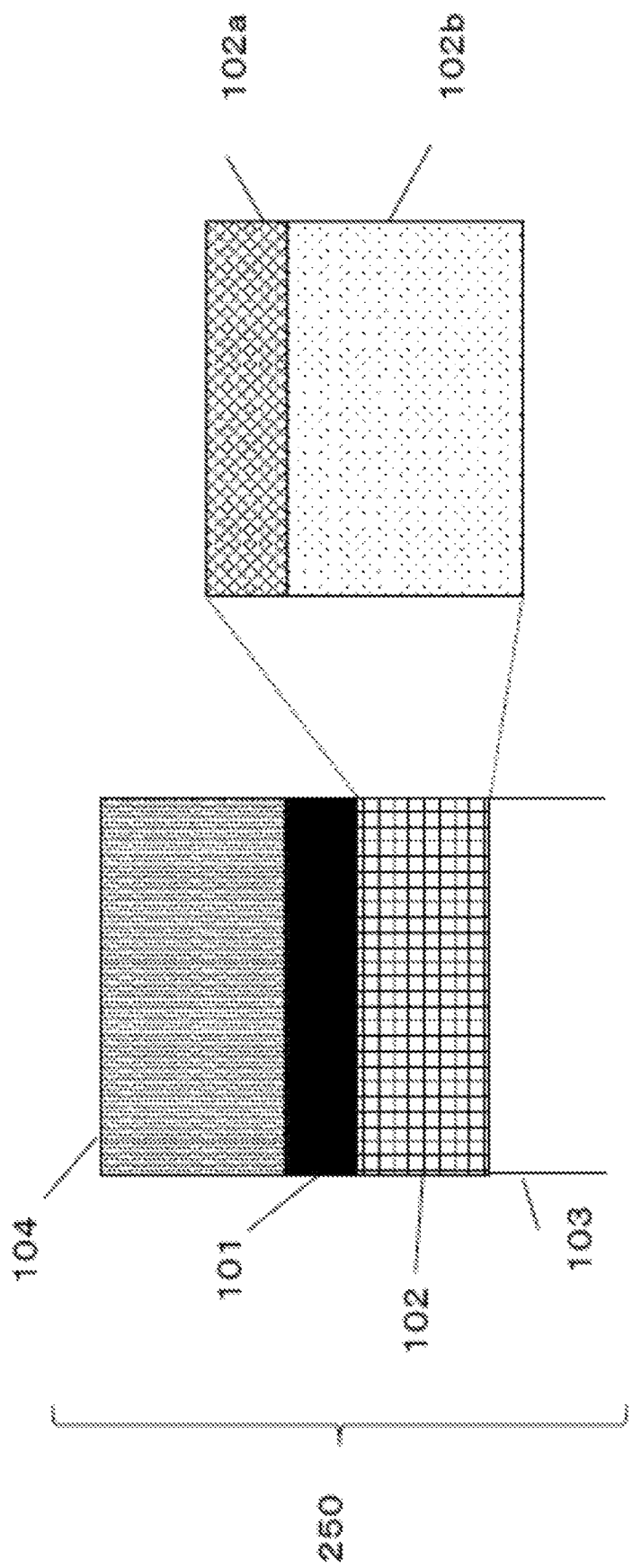
FIG. 2 is a schematic cross-sectional view illustrating a configuration of a photomask blank according to a second embodiment.

FIGS. 1 and 2 illustrate a photomask blank according to the present invention, wherein FIG. 1 is a schematic cross-sectional view illustrating a configuration of a photomask blank according to a first embodiment, and FIG. 2 is a schematic cross-sectional view illustrating a configuration of a photomask blank according to a second embodiment.

A photomask blank 200 illustrated in FIG. 1 is a transmission-type phase shift mask blank, which is a photomask blank used for fabricating a photomask to which exposure light with a wavelength of 193 nm (which is obtained from an exposure light source such as ArF excimer laser) is applied, and includes a light-transmissive substrate 103, a phase shift film 102 formed on the light-transmissive substrate 103 and provides a phase shift effect, and a light shielding film 101 formed on the phase shift film 102 in contact therewith.

The light shielding film 101 should preferably include chromium as a main component, which is not etched substantially by fluorine-based dry etching but can be etched by oxygen-containing chlorine-based dry etching, and preferably, the chromium content should be 20 atomic % or more.

The phase shift film 102 should preferably have a phase difference of 170 through 190 degrees, and a light transmittance of 20% or more with respect to exposure light, so as to obtain wafer transfer characteristics of a transfer pattern by phase shift effect corresponding to exposure conditions. The phase difference of 180 degree is especially preferable to obtain favorable wafer transfer characteristics.

The phase shift film 102 adopts a two-layer structure composed of a first phase shift film 102b and a second phase shift film 102a. A two-layer structure is adopted since a combination of two kinds of films having different refractive index n and extinction coefficient k enables a wider range of film thickness and light transmittance to be realized compared to a single-layer film.

Regarding the phase shift film 102, in order to reduce pattern dimension fluctuation by exposure, a transition metal such as molybdenum should not be contained. Further, the first phase shift film 102b should be composed of a silicon nitride-based material such as $Si_3N_4$, and the second phase shift film 102a should be composed of a silicon oxynitride-based material such as SiON. The reason for this composition is that in order to thin the phase shift film while maintaining a phase difference of around 177 degrees, it is necessary to realize a phase shift film including a silicon nitride having a large refractive index n and a relatively small extinction coefficient k. However, in the case of a single-layer film using silicon nitride, the light transmittance is approximately 18% at most, and a higher light transmittance cannot be realized. Therefore, a silicon oxynitride-based material having an even smaller extinction coefficient k is laminated as a phase difference adjusting film to realize a two-layer film formed of a film formed of a silicon oxynitride-based material and a film formed of a silicon nitride-based material, which enables to thin the film thickness of the phase shift film 102, and as a result, a good EMF bias as described above can be achieved.

Further, the reason why a silicon oxynitride-based material such as SiON is used as the second phase shift film 102a is that it has a greater refractive index n than silicon oxide that has been conventionally used as the phase difference adjusting film, and that the film thickness of the phase shift film 102 can be further reduced.

Regarding the phase shift film 102, by simultaneously reducing the film thickness of the first phase shift film 102b having a relatively large extinction coefficient k and adjusting the film thickness of the second phase shift film 102a having a relatively small extension coefficient k compared to the first phase shift film 102b, it becomes possible to realize a light transmittance of 30% or higher while maintaining a phase difference of around 180 degrees.

The refractive index n and the extinction coefficient k of the first phase shift film 102b and the second phase shift film 102a are known to be varied according to the composition ratio of nitrogen and silicon of the first phase shift film 102b and the composition ratio of oxygen, nitrogen and silicon of the second phase shift film 102a. Among silicon nitrides existing stably in nature, $Si_3N_4$ has a large refractive index n and relatively small extinction coefficient k, so that it is suitably used in the first phase shift film 102b. Further, among silicon nitride oxides existing stably in nature, SiON has a greater refractive index n and even smaller extinction coefficient k, so that it is suitably used in the second phase shift film 102a. Therefore, $Si_3N_4$ is preferably used for the first phase shift film 102b, and SiON is preferably used for the second phase shift film 102a. If $Si_3N_4$ is used for the first phase shift film 102b and SiON is used for the second phase shift film 102a, the refractive index $n_1$ of the first phase shift film 102b may be 2.5 or more and 2.75 or less, the refractive index $n_2$ of the second phase shift film 102a may be 1.55 or more and 2.20 or less, the extinction coefficient $k_1$ of the first phase shift film 102b may be 0.2 or more and 0.4 or less, and the extinction coefficient $k_2$ of the second phase shift film 102a may be greater than 0 and no greater than 0.1.

In the following description, a film formed on the light-transmissive substrate 103 in contact therewith is referred to as a "lower layer film" and a film formed above the lower layer film is referred to as an "upper layer film". In the phase shift film 102 illustrated in FIG. 1 or 2, the first phase shift film 102b using silicon nitride-based material such as $Si_3N_4$ is formed on the light-transmissive substrate 103 in contact therewith, and the second phase shift film 102a using silicon oxynitride-based material such as SiON is laminated thereon, so that the lower layer film is the first phase shift film 102b using silicon nitride-based material, and the upper layer film is the second phase shift film 102a using silicon oxynitride-based material. However, the lamination order can be opposite. That is, the phase shift film 102 may adopt a laminated structure in which the lower layer film is the second phase shift film 102a using silicon oxynitride-based material and the upper layer film is the first phase shift film 102b using silicon nitride-based material. Incidentally, as illustrated in FIGS. 1 and 2, in the case of the phase shift film 102 adopting a laminated structure in which the lower layer film is the first phase shift film 102b and the upper layer film is the second phase shift film 102a, it has better wafer transfer characteristics such as NILS compared to the film adopting an opposite structure (laminated structure in which the upper layer film is the first phase shift film 102b and the lower layer film is the second phase shift film 102a). Specific examples will be described later.

Further, in the case of the phase shift film 102 adopting a laminated structure in which the upper layer film is the first phase shift film 102b and the lower layer film is the second phase shift film 102a, while dry-etching the phase shift film 102 using fluorine-based gas, end point detection using plasma emission becomes difficult since the compositions of the light-transmissive substrate 103 and the second phase shift film 102a are extremely similar. Further, in etching the phase shift film 102 using an electron beam corrector, a success rate of correction is deteriorated, since end point detection is difficult by the same reason mentioned above and selectivity with the light-transmissive substrate 103 is small. In consideration of these issues, the phase shift film 102 should preferably adopt a laminated structure as illustrated in FIGS. 1 and 2, where the lower layer film is the first phase shift film 102b and the upper layer film is the second phase shift film 102a. Therefore, in the following description, unless denoted otherwise, the phase shift film 102 in which the lower layer film is the first phase shift film 102b and the upper layer film is the second phase shift film 102a will be described.

Further, considering the wafer transfer characteristics such as NILS, the film thickness $D_1$ of the first phase shift film 102b and the film thickness $D_2$ of the second phase shift film 102a of the phase shift film 102 should preferably satisfy a relationship of $$D_1(\text{nm}) > -0.5 \cdot D_2(\text{nm}) + 45 \text{ nm, and}$$

$$D_1(\text{nm}) < -0.5 \cdot D_2(\text{nm}) + 75 \text{ nm.}$$

A photomask blank 250 illustrated in FIG. 2 adopts a similar basic configuration as the photomask 200 illustrated in FIG. 1 but differs therefrom in that a resist film 104 is further formed on the light shielding film 101.

The film thickness of the resist film 104 should preferably be 70 nm or more and 150 nm or less in order to prevent collapse of resist pattern when forming a fine pattern.

A configuration as illustrated in FIG. 1 (or FIG. 2) is typical in a phase shift mask blank, but a film other than those described above can be laminated. For example, a different film (in the following description, this film is referred to as a "pattern processing film") can be laminated on the photomask blank illustrated in FIG. 1. Hereafter, an example of a phase shift mask blank having such configuration will be described.

Figure 3:
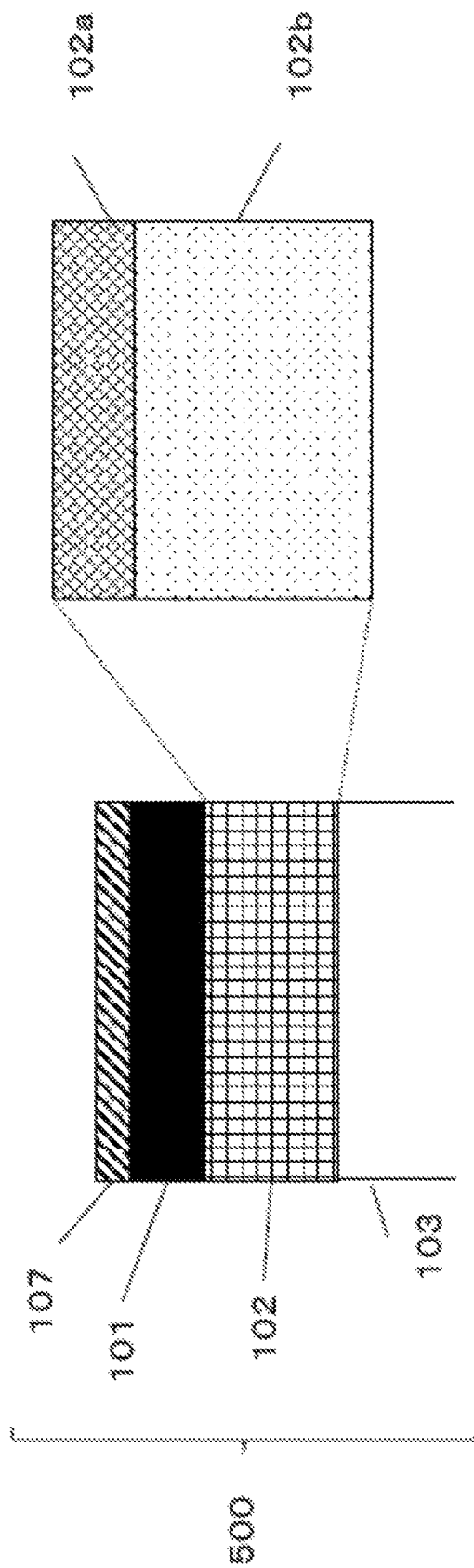
FIG. 3 is a schematic cross-sectional view illustrating a configuration of a photomask blank in which a pattern processing film is deposited on a light shielding film.

FIG. 3 is a schematic cross-sectional view of a photomask blank adopting a configuration where a pattern processing film is deposited on the light shielding film 101 of the photomask 200 described with reference to FIG. 1. In a photomask blank 500 of FIG. 3, characteristics (such as the film thickness or the composition) of the light shielding film 101 and the phase shift film 102 are the same as those illustrated in FIGS. 1 and 2. A pattern processing film 107 formed on the light shielding film 101 is a film formed using a material, such as silicon-based material, that can be dry-etched by fluorine-based dry etching.

Figure 4:
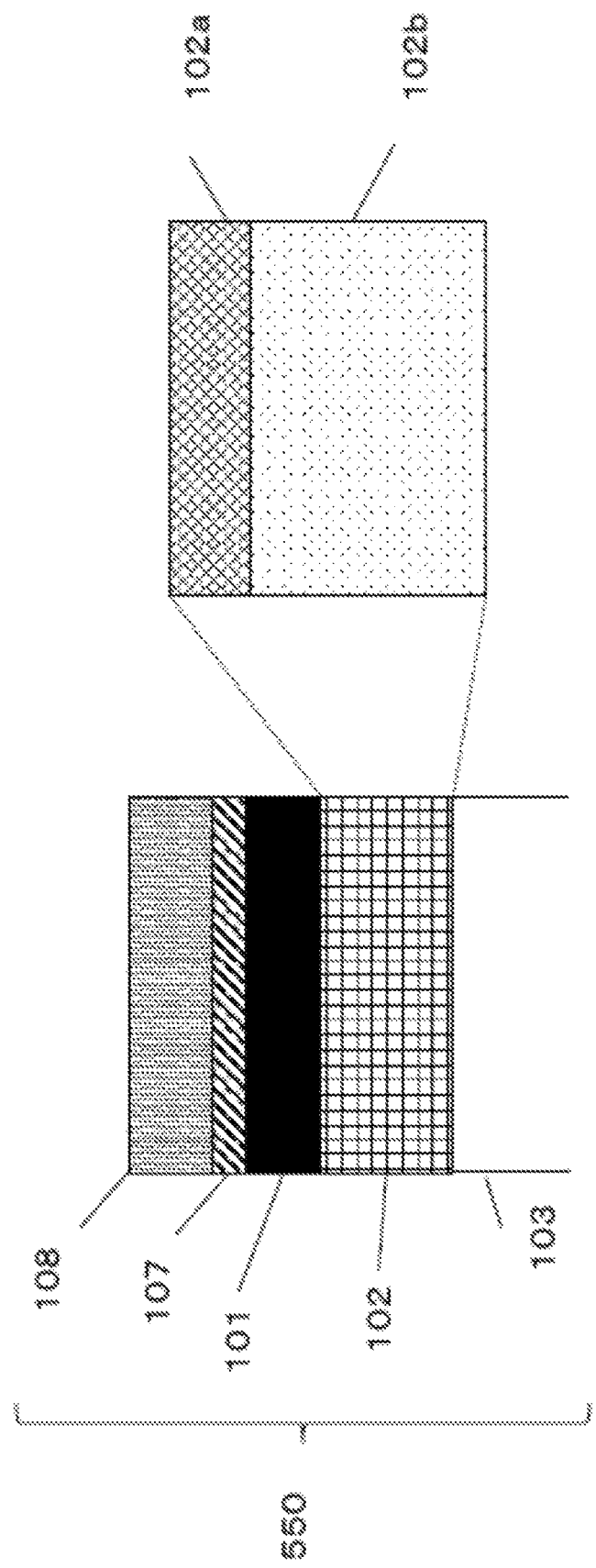
FIG. 4 is a schematic cross-sectional view illustrating a configuration of a photomask blank in which a pattern processing film and a resist film are laminated on the light shielding film.

Meanwhile, a photomask blank 550 illustrated in FIG. 4 is a schematic cross-sectional view illustrating a structure of the photomask blank 550 in which a resist film 108 is further laminated on the pattern processing film 107 of the photomask blank 500 of FIG. 3. The photomask blank 550 is the same as the photomask blank 500 other than the point that the resist film 108 is laminated.

By forming the photomask blank to have a configuration as illustrated in FIGS. 3 and 4, the film thickness of the resist film 108 can be reduced, and as a result, collapse of resist during the developing step can be reduced. The film thickness of the resist film 108 should preferably be 70 nm or more and 100 nm or less to prevent collapse of resist pattern when forming a fine pattern.

Figure 5:
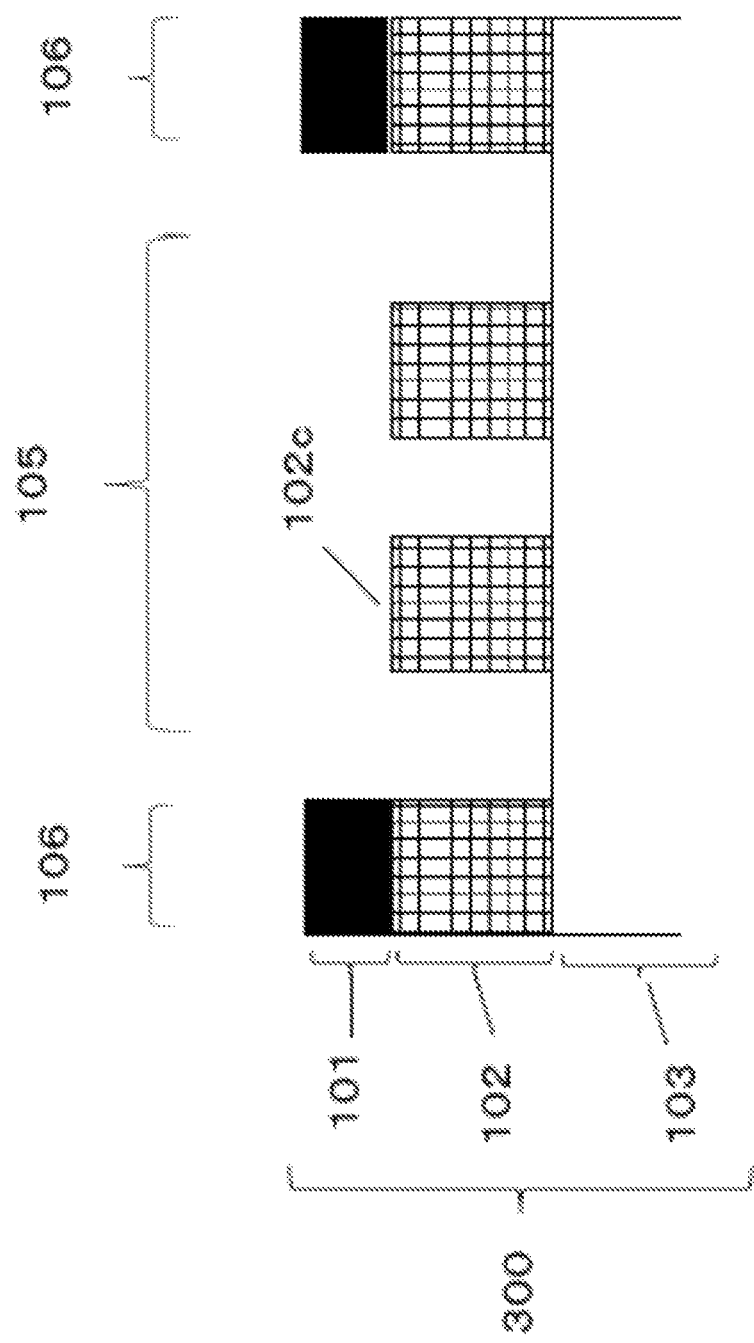
FIG. 5 is a schematic cross-sectional view illustrating a configuration of a photomask according to the embodiment of the present invention.

FIG. 5 is a schematic cross-sectional view illustrating a structure of the photomask according to an embodiment of the present invention. A photomask 300 illustrated in FIG. 5 is a transmission-type phase shift mask that is fabrication using the photomask 200 (or 250) illustrated in FIG. 1 (or FIG. 2) or the photomask blank 500 (or 550) illustrated in FIG. 3 (or FIG. 4). The photomask 300 illustrated in FIG. 5 is a photomask to which exposure light having a wavelength of 193 nm is applied and includes at least a light-transmissive substrate 103 and a circuit pattern formed by etching the phase shift film 102 on the light-transmissive substrate 103. As described above, the phase shift film 102 is a film composed by laminating the first phase shift film 102b and the second phase shift film 102a.

In FIG. 5, the area denoted by reference number 105 is referred to as an effective area 105, and the effective area 105 is an area including a circuit pattern (area in which the circuit pattern is arranged). Further, a periphery portion pattern 106 composed of the phase shift film 102 and the light shielding film 101 laminated thereon is provided on the periphery portion of the effective area 105. In the following description, the portion of the phase shift film 102 constituting the circuit pattern and the periphery portion pattern is referred to as a "phase shift film pattern 102c".

Incidentally, light transmittance of the periphery portion pattern 106 with respect to exposure light should preferably be 0.1% or less. The reason of this configuration is to prevent light other than the desired exposure light from being irradiated onto the wafer. Normally, an exposure device called a stepper is used to transfer the mask pattern onto the resist on the wafer, where exposure region is set by a mechanical shutter and step-and-repeat is performed to realize reduced size projection exposure, and the periphery portion pattern 106 is used to prevent overlap exposure light at the boundary portion of the respective exposure steps. This is because if the transmittance of the periphery portion pattern with respect to exposure wavelength is greater than 0.1%, the overlap exposure light will create a pattern.

Figure 6:
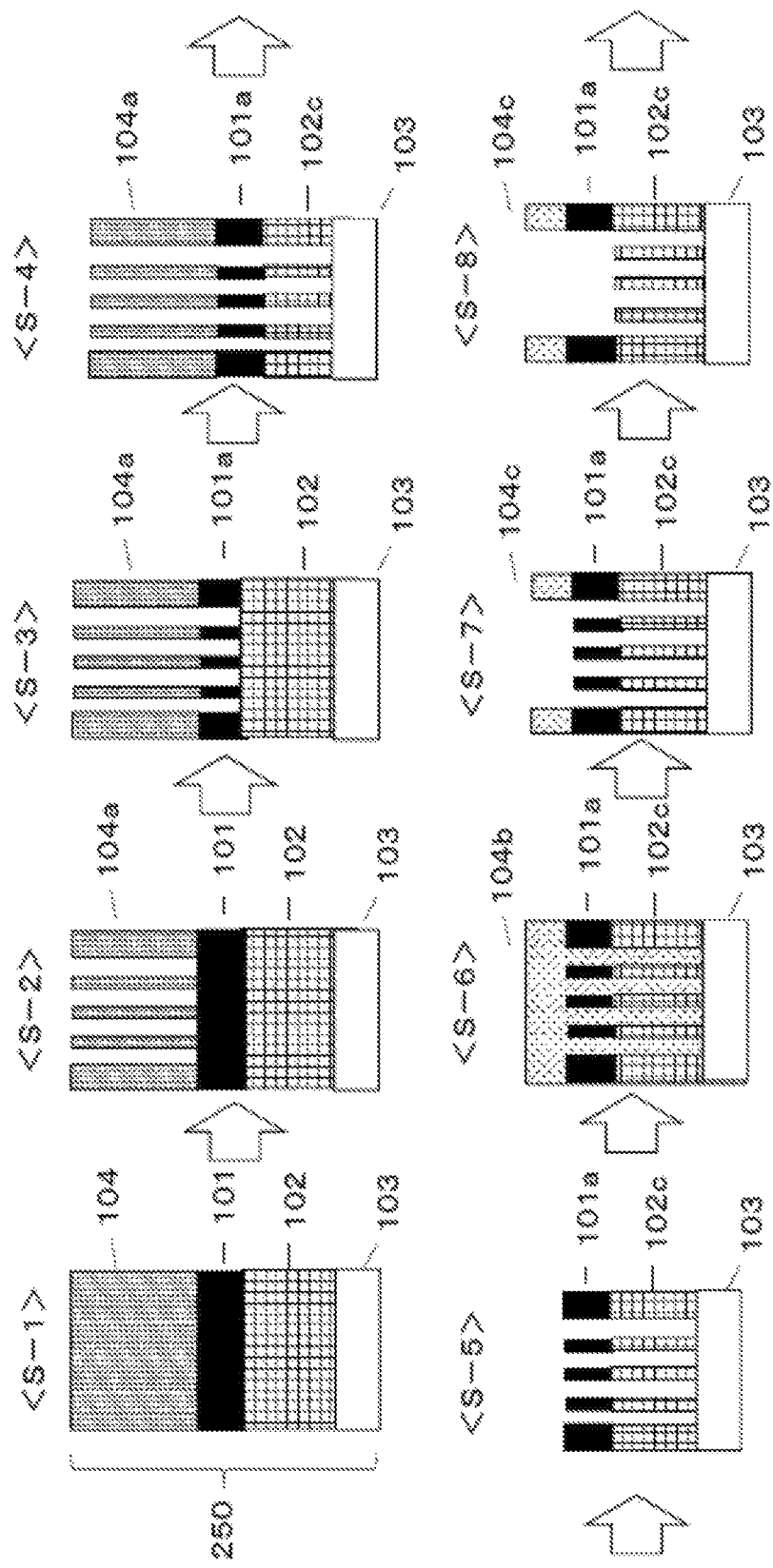
FIG. 6 is a schematic view illustrating a photomask manufacturing method according to the embodiment of the present invention.
Figure 7:
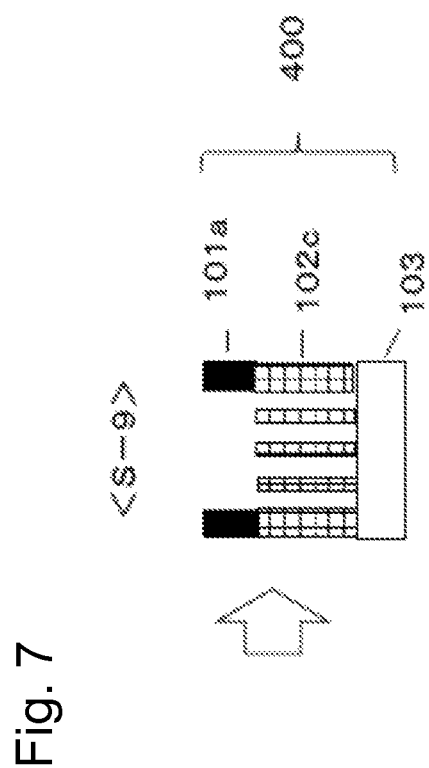
FIG. 7 is a schematic view illustrating a photomask manufacturing method according to the embodiment of the present invention.

Next, a photomask manufacturing method according to the embodiment of the present invention will be described. FIGS. 6 and 7 illustrate a flow of the steps for manufacturing the photomask based on the form of the photomask blank 250 illustrated in FIG. 2 on which the resist film 104 is formed.

At first, steps (FIG. 6<S-1>, <S-2> and <S-3>) for forming an etching mask pattern 101a on the light shielding film 101 by performing dry etching using oxygen-containing chlorine-based gas to the light shielding film 101 using a first resist pattern 104a (obtained by drawing a circuit pattern on the resist film 104 and developing the same) formed on the light shielding film 101 of the photomask blank 250 as a mask are performed. Next, a step (FIG. 6<S-4>) for forming the phase shift film pattern 102c on the phase shift film 102 by performing dry etching using fluorine-based gas to the phase shift film 102 using an etching mask pattern 101a formed on the light shielding film 101 as a mask is performed.

Next, a step (FIG. 6<S-5>) for removing the first resist pattern 104a remaining on the etching mask pattern 101a is performed. Thereafter, a step (FIG. 6<S-6>) for applying the resist film 104b thereon and a step (FIG. 6<S-7>) for forming a second resist pattern 104c on the periphery portion by drawing a pattern on the resist film 104b and developing the same are performed. Next, a step (FIG. 6<S-8>) for removing a portion of the light shielding film 101 (etching mask pattern 101a) by performing dry etching using oxygen-containing chlorine-based gas and using the second resist pattern 104c formed on the periphery portion as a mask is performed. Lastly, a step (FIG. 7<S-9>) for forming a periphery portion pattern (composed of the phase shift film pattern 102c and the light shielding film 101 (etching mask pattern 101a) laminated on the phase shift film pattern 102c) by removing the second resist pattern 104c formed on the periphery portion is performed, to thereby fabricate a photomask 400. The resist pattern can be removed by sulfuric acid hydration cleaning. Further, a laser drawing device can be used for drawing patterns.

Figure 8:
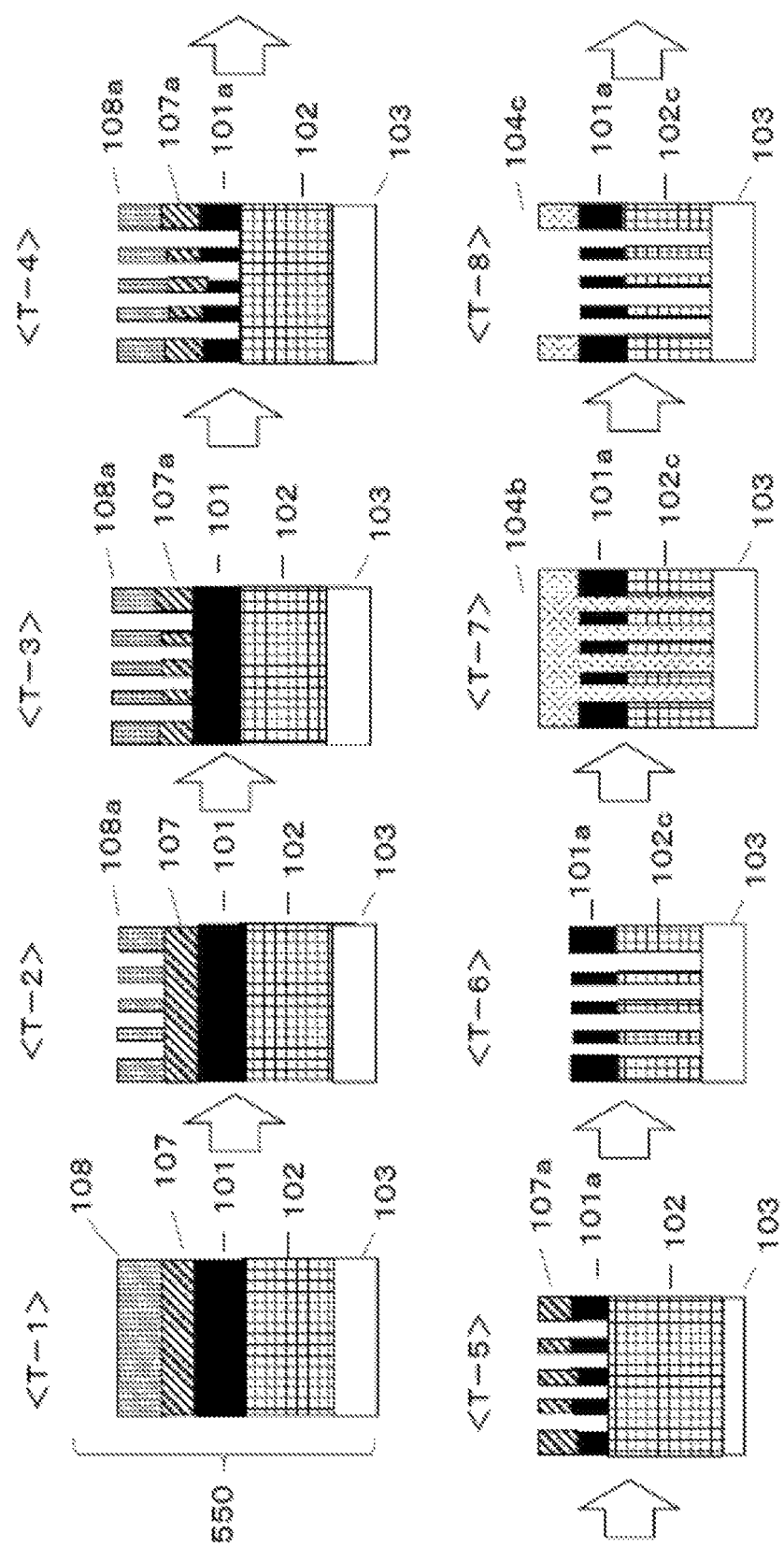
FIG. 8 is a schematic view of a photomask manufacturing method using a photomask blank in which a pattern processing film is deposited on a light shielding film.
Figure 9:
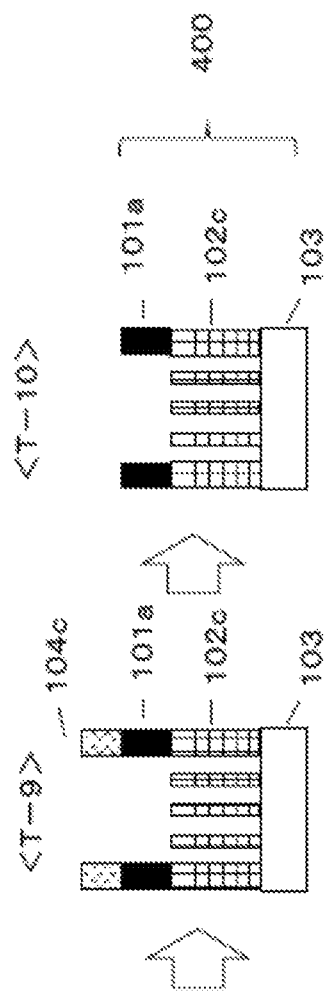
FIG. 9 is a schematic view of a photomask manufacturing method according to the embodiment of the present invention in which the pattern processing film is deposited on the light shielding film.

FIGS. 8 and 9 illustrate a flow of the steps for manufacturing a photomask from the photomask blank 550 illustrated in FIG. 4.

At first, steps (FIG. 8<T1>, <T2> and <T3>) for forming a pattern-processing pattern 107a on the pattern processing film 107 by performing dry etching using fluorine-based gas to the pattern processing film 107 using a first resist pattern 108a (obtained by drawing a circuit pattern on the resist film 108 and developing the same) formed on the pattern processing film 107 of the photomask blank 550 as a mask are performed. Next, a step (FIG. 8<T-4>) for forming the etching mask pattern 101a on the light shielding film 101 by performing dry etching using oxygen-containing chlorine-based gas to the light shielding film 101 is performed.

Next, a step (FIG. 8<T-5>) for removing the first resist pattern 108a remaining on the etching mask pattern 101a is performed.

Thereafter, a step (FIG. 8<T-6>) for forming the phase shift film pattern 102c on the phase shift film 102 by performing dry etching using fluorine-based gas to the phase shift film 102 using the etching mask pattern 101a formed on the light shielding film 101 as a mask is performed. Here, the pattern-processing pattern 107a is simultaneously etched with the phase shift film 102 by the fluorine-based gas and removed.

The steps performed hereafter are similar to the steps (FIG. 6<S-6> to FIG. 7<S-9>) described with reference to FIGS. 6 and 7. At first, as illustrated in FIG. 8<T-7>, a step for applying the resist film 104b is performed, and then a step (FIG. 8<T-8>) for forming the second resist pattern 104c on the periphery portion by drawing a pattern on the resist film 104b and developing the same is performed. Next, a step (FIG. 9<T-9>) for removing a portion of the light shielding film 101 (the etching mask pattern 101a) by performing dry etching using oxygen-containing chlorine-based gas and using the second resist pattern 104c formed on the periphery portion as a mask is performed. Lastly, a step (FIG. 9<T-10>) for forming a periphery portion pattern (composed of the phase shift film pattern 102c and the light shielding film 101 (etching mask pattern 101a) laminated on the phase shift film pattern 102c) by removing the second resist pattern 104c formed on the periphery portion is performed, to thereby fabricate the photomask 400. The resist pattern can be removed by sulfuric acid hydration cleaning. Further, a laser drawing device can be used for drawing patterns.

As described above, the pattern processing film should preferably be composed of a silicon-based material capable of being etched by fluorine-based gas. Further, the film thickness of the pattern processing film should preferably be 5 nm or more and 10 nm or less to completely etch the pattern-processing pattern 107a during the etching time of the phase shift film 102 in the step illustrated in FIG. 9<T-6>.

Example

In this Example, wafer transfer characteristics were evaluated by wafer transfer simulation so as to verify the validity of the photomask blank according to the present invention and the photomask manufacturing method using the same.

Simulation evaluation was obtained by performing calculation using S-Litho manufactured by Synopsys, Inc.

<Simulation Evaluation Conditions>

NA: 1.35

Sigma: QS X-0 deg, BL: 32 deg/Y-90 deg, BL: 37 deg

Polarization: Azimuthally polarization

Target: 52 nm dense hole (Negative tone develop)

Pitch: 100 nm

Refractive index $n_1$ of first phase shift film 102b: 2.60

Extinction coefficient $k_1$ of first phase shift film 102b: 0.35

Refractive index $n_2$ of second phase shift film 102a: 1.85

Extinction coefficient $k_2$ of second phase shift film 102a: 0.004

In order to verify the validity of the photomask blank according to the present invention, as a comparative example, wafer transfer simulation was also performed to a conventional phase shift film, that is, phase shift film composed of silicon, molybdenum, oxygen and nitrogen. The characteristics of the phase shift film according to the comparative example are as follows.

Comparative Example

Transmittance: 6%

Film thickness: 75 nm

Phase difference: 177.0 degrees

Refractive index n: 2.3

Extinction coefficient k: 0.55

The composition is as follows: 10 atomic % molybdenum content, 30 atomic % silicon content, 10 atomic % oxygen content, and 50 atomic % nitrogen content.

The result of wafer transfer simulation regarding the phase shift film according to the comparative example is illustrated in Table 1.

TABLE 1

|  | COMPARATIVE EXAMPLE |
|---|---|
| LIGHT TRANSMITTANCE OF PHASE SHIFT FILM 102 [%] | 6% |
| NILS | 1.79 |
| DOF[um] | 0.51 |
| MEEF | 6.2 |
| EMF BIAS | 13.0 |

(1) Evaluation of Film Thickness and Light Transmittance

At first, the relationship between light transmittance and film thicknesses of the first phase shift film 102b using silicon nitride-based material and the second phase shift film 102a using silicon oxynitride-based material was evaluated. In the present example, the combination of the first phase shift film 102b and the second phase shift film 102a capable of realizing a transmittance of 30%, 40%, 50% and 60% of the phase shift film 102 is obtained by calculation, which is compared with the comparative example described above. In the following description, regarding the phase shift film 102 having a transmittance of 30%, 40%, 50% or 60%, the first phase shift film 102b serving as the lower layer film and the second phase shift film 102a serving as the upper layer film are respectively referred to as "phase shift film 102 of example 1", "phase shift film 102 of example 2", "phase shift film 102 of example 3" and "phase shift film 102 of example 4".

Upon computing the film thicknesses of the first phase shift film 102b and the second phase shift film 102a constituting the phase shift film 102 of Examples 1 through 4, in a state where the phase difference at a wavelength of exposure light of ArF excimer laser is approximately 177 degrees, the film thickness of the first phase shift film 102b and the film thickness of the second phase shift film 102a that realize a minimum total film thickness for the respective light transmittances of the phase shift film 102 were computed. The computed results (film thicknesses of the first phase shift film 102b and the second phase shift film 102a constituting the phase shift film 102 of Examples 1 through 4) are shown in the following Table 2.

TABLE 2

|  | COMPARATIVE EXAMPLE | EXAMPLE 1 | EXAMPLE 2 | EXAMPLE 3 | EXAMPLE 4 |
|---|---|---|---|---|---|
| LIGHT TRANSMITTANCE OF PHASE SHIFT FILM 102 [%] | 6% | 30% | 40% | 50% | 60% |
| FILM THICKNESS OF SECOND PHASE SHIFT FILM 102a [nm] | NONE | 22 | 51 | 62 | 73 |
| FILM THICKNESS OF FIRST PHASE SHIFT FILM 102b [nm] | NONE | 49 | 33 | 28 | 22 |
| TOTAL FILM THICKNESS OF PHASE SHIFT FILM 102 [nm] | 75 | 71 | 84 | 90 | 95 |
| PHASE DIFFERENCE [degrees] | 177.0 | 177.0 | 177.0 | 177.0 | 177.0 |

As can be recognized from Table 2, as the light transmittance of the phase shift film 102 increases, the film thickness of the first phase shift film 102b is reduced and the film thickness of the second phase shift film 102a is increased. Further, the total film thickness of the phase shift film 102 increases as the light transmittance of the phase shift film 102 increases, but according to the phase shift film 102 of the present embodiment, the total film thickness of the phase shift film 102 (phase shift film 102 of example 1) of the case where the light transmittance is 30% is 71 nm, which means that a high light transmittance could be realized by a film thickness that is thinner than the phase shift film of the comparative example.

Next, the phase shift film 102 in which the first phase shift film 102b and the second phase shift film 102a are laminated in an opposite order as the phase shift film 102 of Examples 1 through 4 was evaluated. In the following description, the phase shift film 102 having a transmittance of 30%, 40%, 50% or 60% and wherein the first phase shift film 102b is used as the upper layer film and the second phase shift film 102a is used as the lower layer film are respectively referred to as "the phase shift film 102 of example 5", "the phase shift film 102 of example 6", "the phase shift film 102 of example 7", and "the phase shift film 102 of example 8". Similar to the phase shift film 102 of Examples 1 through 4, in order to obtain the film thicknesses of the first phase shift film 102b and the second phase shift film 102a constituting the phase shift film 102 of Examples 5 through 8, the film thickness of the first phase shift film 102b and the film thickness of the second phase shift film 102a realizing a minimum total film thickness at the respective light transmittances of the phase shift film 102 in a state where the phase difference at the wavelength of exposure light of ArF excimer laser is approximately 177 degrees were computed. The results are shown in the following Table 3.

the phase shift film 102 according to the embodiment of the present invention realizes a high light transmittance by a similar film thickness as the phase shift film of the comparative example.

Figure 10:
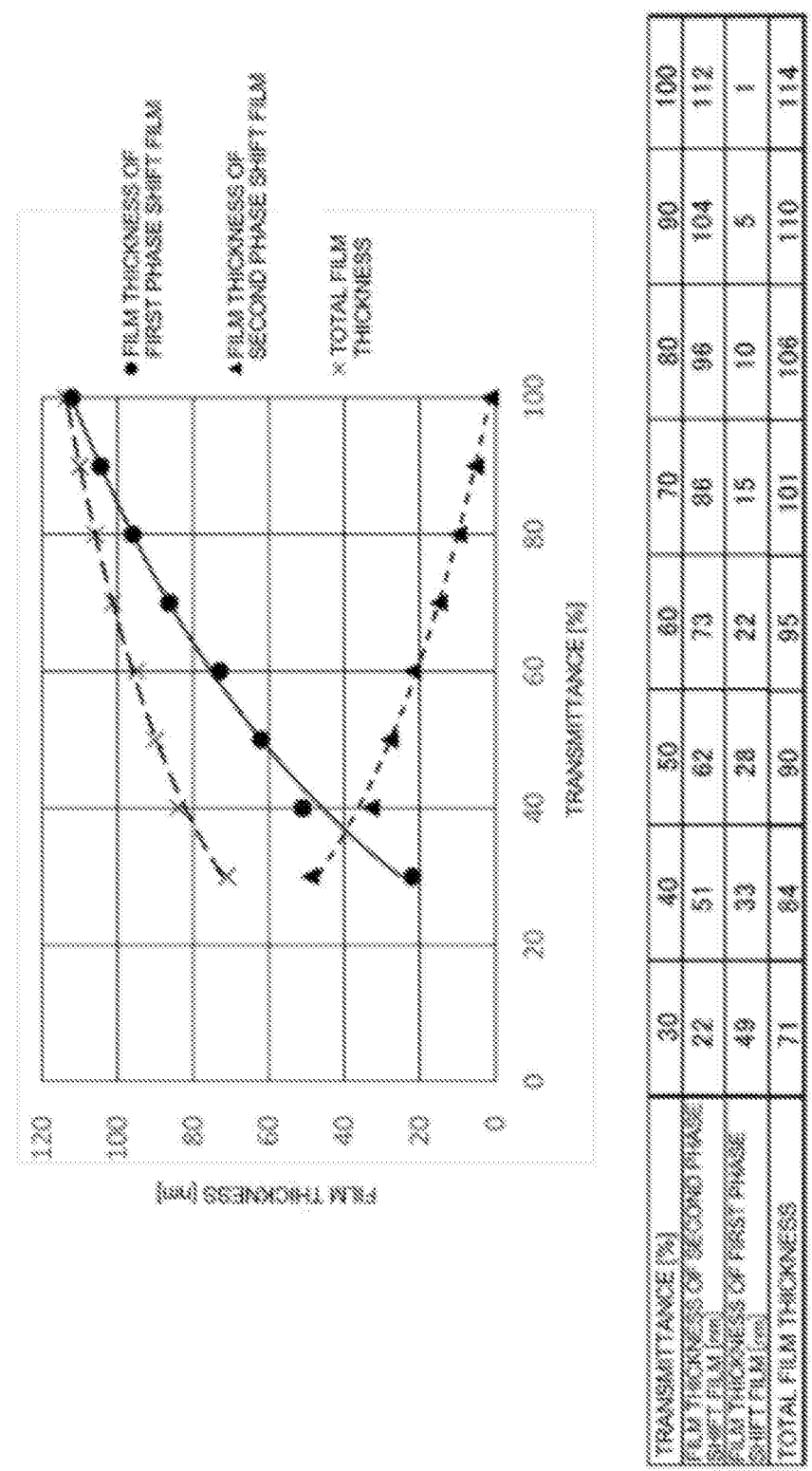
FIG. 10 is a view illustrating a relationship between film thickness and light transmittance of the phase shift film.

Further, the change of film thickness of the phase shift film in a state where the light transmittance is varied from 30% to 100% was calculated. The results are illustrated in FIG. 10. The table illustrated on the lower portion of FIG. 10 illustrates the film thickness of the second phase shift film, the film thickness of the first phase shift film and the total film thickness of the phase shift film (which is the sum of film thickness of the first phase shift film and film thickness of the second phase shift film) of cases where the light transmittance is 30%, 40%, 50%, 60%, 70%, 80%, 90% and 100%, and the graph on the upper part of FIG. 10 shows the result thereof. The result of FIG. 10 is a result of calculation of the case where the first phase shift film 102b is used as the lower layer film and the second phase shift film 102a is used as the upper layer film, similar to the phase shift film 102 of Examples 1 through 4.

As can be recognized from FIG. 10, the total film thickness should be set to a value that is greater 70 nm and is 114 nm or less to realize a light transmittance of 30% or more.

Further, based on Tables 2 and 3, it can be recognized that the structure where the first phase shift film 102b is used as the lower layer film and the second phase shift film 102a is used as the upper layer film (Examples 1 through 4) realizes a thinner film thickness than the phase shift film 102 of Examples 5 through 8.

(2) Evaluation of Wafer Transfer Characteristics

Next, Table 4 shows NILS, DOF, MEEF and EMF bias obtained by calculation regarding the photomask 400 using

TABLE 3

| | COMPARATIVE EXAMPLE | EXAMPLE 5 | EXAMPLE 6 | EXAMPLE 7 | EXAMPLE 8 |
|---|---|---|---|---|---|
| LIGHT TRANSMITTANCE OF PHASE SHIFT FILM 102 [%] | 6% | 30% | 40% | 50% | 60% |
| FILM THICKNESS OF FIRST PHASE SHIFT FILM 102b [nm] | NONE | 43 | 33 | 18 | 10 |
| FILM THICKNESS OF SECOND PHASE SHIFT FILM 102a [nm] | NONE | 30 | 52 | 80 | 92 |
| TOTAL FILM THICKNESS OF PHASE SHIFT FILM 102 [nm] | 75 | 73 | 85 | 98 | 102 |
| PHASE DIFFERENCE [degrees] | 177.0 | 177.0 | 177.0 | 177.0 | 177.0 |

It has been recognized that also according to the phase shift film 102 of Examples 5 through 8, the film thickness of the first phase shift film 102b was reduced and the film thickness of the second phase shift film 102a was increased as the light transmittance of the phase shift film 102 was increased, similar to the phase shift film 102 of Examples 1 through 4. Further, since the total film thickness of the phase shift film 102 according to example 5 (where the light transmittance is 30%) was 73 nm, it can be recognized that the phase shift films 102 of Examples 1 through 4 and the photomask 400 using the phase shift film 102 of the comparative example, improvement rate of the respective Examples with respect to the comparative example, and average improvement rate of each Example. Evaluation was performed by setting the phase difference of the photomask 400 to 180 degrees, in order to realize more preferable transfer characteristics.

TABLE 4

| | COMPARATIVE EXAMPLE | EXAMPLE 1 | EXAMPLE 2 | EXAMPLE 3 | EXAMPLE 4 |
|---|---|---|---|---|---|
| LIGHT TRANSMITTANCE OF PHASE SHIFT FILM 102 [%] | 6% | 30% | 40% | 50% | 60% |
| NILS | 1.79 | 2.26 | 1.94 | 2.01 | 1.98 |
| DOF[um] | 0.51 | 0.53 | 0.52 | 0.53 | 0.52 |
| MEEF | 6.2 | 5.0 | 5.8 | 5.3 | 5.5 |
| EMF BIAS | 13.0 | 8.4 | 6.1 | 6.9 | 6.1 |
| NILS IMPROVEMENT RATE TO COMPARATIVE EXAMPLE [%] | | 25.8 | 8.17 | 12.08 | 10.41 |
| DOF IMPROVEMENT RATE TO COMPARATIVE EXAMPLE [%] | | 3.6 | 2.6 | 4.5 | 2.6 |
| MEEF IMPROVEMENT RATE TO COMPARATIVE EXAMPLE [%] | | 19.9 | 6.1 | 15.3 | 11.1 |
| EMF BIAS IMPROVEMENT RATE TO COMPARATIVE EXAMPLE [%] | | 35.3 | 53.1 | 47.0 | 53.2 |
| AVERAGE VALUE OF IMPROVEMENT RATE [%] | | 21.2 | 17.5 | 23.2 | 22.3 |

As a result, it has been recognized that all items were improved in the photomask 400 using the phase shift film 102 of Examples 1 through 4 compared to the phase shift film of the comparative example. Therefore, the photomask according to the present invention is effective in realizing high wafer transfer characteristics.

Further, regarding NILS, the photomask 400 using the phase shift film 102 of example 1 shows the most preferable result.

Next, the NILS, DOF, MEEF and EMF bias for photomask 400 fabricated using the phase shift film 102 of Examples 5 through 8 were evaluated. This evaluation is also performed with the phase difference of the photomask 400 set to 180 degrees.

Regarding the photomask 400 using the phase shift film 102 of Examples 5 through 8 and the comparative example, the NILS, DOF, MEEF and EMF bias with respect to the light transmittance at the wavelength of exposure light of ArF excimer laser were obtained by calculation, and results of improvement rates of the respective Examples with respect to the comparative example and average improvement rate of the respective Examples are shown in Table 5.

Regarding the improvement rate of Table 5, "-" indicates that the improvement rate has been deteriorated.

TABLE 5

| | COMPARATIVE EXAMPLE | EXAMPLE 5 | EXAMPLE 6 | EXAMPLE 7 | EXAMPLE 8 |
|---|---|---|---|---|---|
| LIGHT TRANSMITTANCE OF PHASE SHIFT FILM 102 [%] | 6% | 30% | 40% | 50% | 60% |
| NILS | 1.79 | 2.13 | 1.91 | 1.82 | 1.95 |
| DOF[um] | 0.51 | 0.52 | 0.52 | 0.51 | 0.51 |
| MEEF | 6.2 | 6.4 | 6.4 | 4.6 | 4.6 |
| EMF BIAS | 13.0 | 9.1 | 8.6 | 6.5 | 7.1 |
| NILS IMPROVEMENT RATE TO COMPARATIVE EXAMPLE [%] | | 18.7 | 6.3 | 1.5 | 8.7 |
| DOF IMPROVEMENT RATE TO COMPARATIVE EXAMPLE [%] | | 1.6 | 1.7 | 1.3 | 0.6 |

TABLE 5-continued

| | COMPARATIVE EXAMPLE | EXAMPLE 5 | EXAMPLE 6 | EXAMPLE 7 | EXAMPLE 8 |
|---|---|---|---|---|---|
| MEEF IMPROVEMENT RATE TO COMPARATIVE EXAMPLE [%] | | −3.1 | −2.3 | 26.6 | 26.5 |
| EMF BIAS IMPROVEMENT RATE TO COMPARATIVE EXAMPLE [%] | | 29.6 | 34.0 | 49.4 | 44.8 |
| AVERAGE VALUE OF IMPROVEMENT RATE [%] | | 11.7 | 9.9 | 19.7 | 20.2 |

As a result, it can be recognized that all Examples 1 through 8 were able to achieve favorable wafer transfer characteristics than the comparative example, and that they are valid for wafer fabrication. However, regarding Examples 5 through 8, improvement has been seen compared to the comparative example based on the average value of improvement, but it can be seen that MEEF is deteriorated in Examples 5 and 6.

Further, the photomasks using the phase shift film 102 of examples 5 through 8 have smaller improvement rates compared to Examples 1 through 4. Therefore, the structure where the first phase shift film 102b is used as the lower layer film and the second phase shift film 102a is used as the upper layer film as according to Examples 1 through 4 was more preferable since a more favorable wafer transfer characteristics could be obtained.

Figure 12:
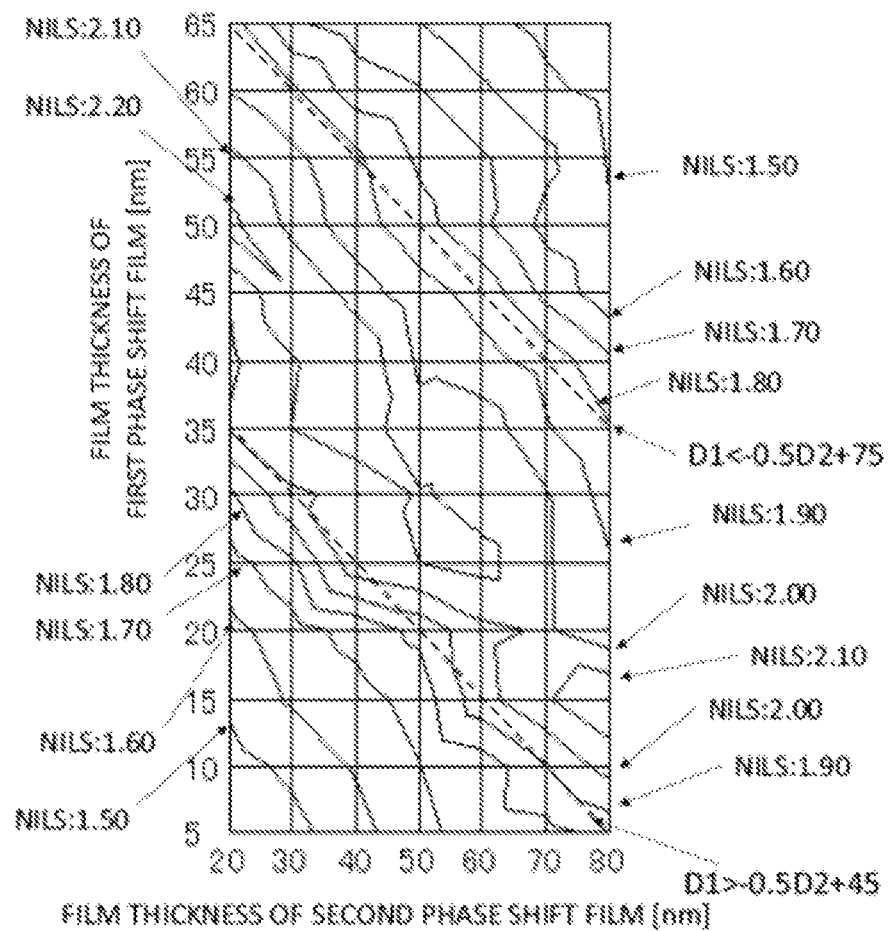
FIG. 12 is a graph illustrating a relationship between film thickness $D_1$ of the first phase shift film and film thickness $D_2$ of the second phase shift film, and NILS.
Figure 14:
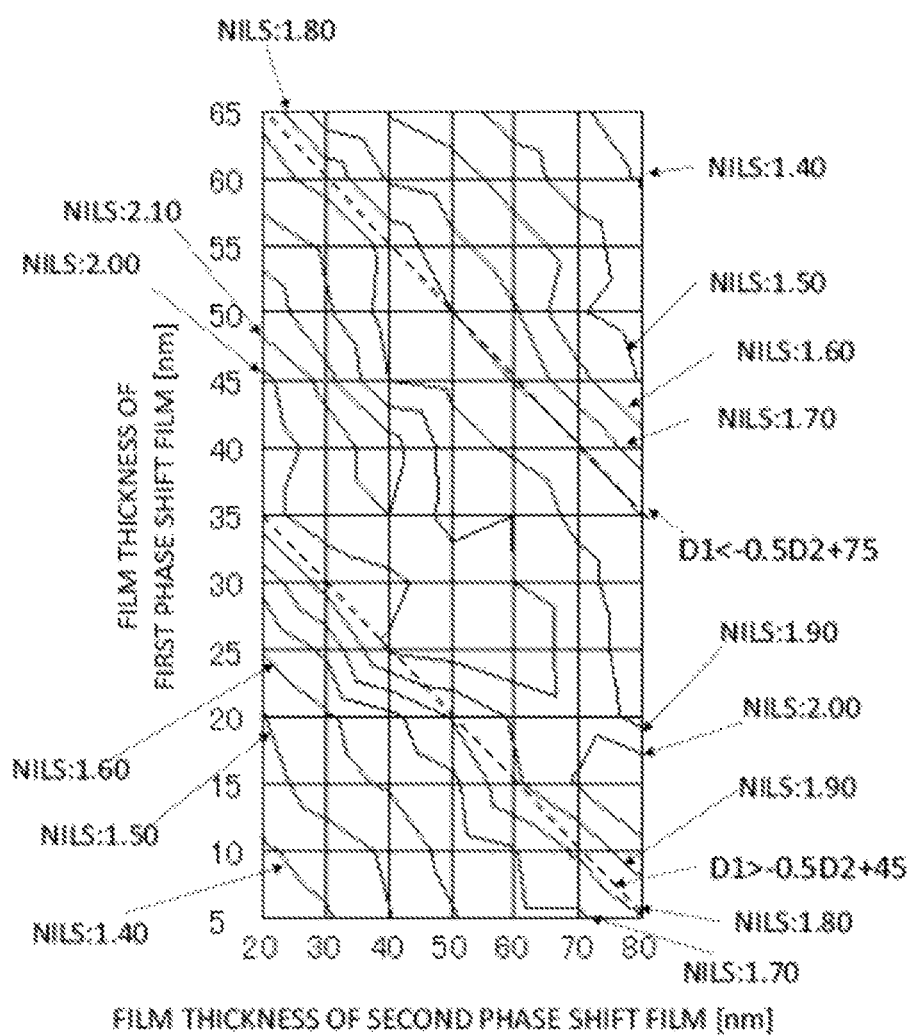
FIG. 14 is a graph illustrating a relationship between film thickness $D_1$ of the first phase shift film and film thickness $D_2$ of the second phase shift film, and NILS.

Next, the values of NILS in a state where the film thickness $D_1$ of the first phase shift film 102b and the film thickness $D_2$ of the second phase shift film 102a were varied were examined. FIG. 11 illustrates the values of NILS of the phase shift film 102 in which the first phase shift film 102b is used as the lower layer film and the second phase shift film 102a is used as the upper layer film in a state where $D_1$ is varied within the range of 5 nm to 65 nm and $D_2$ is varied within the range of 20 nm to 80 nm using wafer transfer simulation, and FIG. 12 shows this result on a graph. Meanwhile, FIG. 13 illustrates the values of NILS of the phase shift film 102 in which the second phase shift film 102a is used as the lower layer film and the first phase shift film 102b is used as the upper layer film in a state where the film thicknesses $D_1$ and $D_2$ are varied, and FIG. 14 shows this result in a graph.

The simulation evaluation was obtained by performing calculation using S-Litho manufactured by Synopsys, Inc., similar to the aforementioned example, and the evaluation conditions were the same as the aforementioned example.

As shown in Table 1, the NILS of the phase shift film according to the comparative example is 1.79. As shown in FIGS. 11 through 14, the relationship between the film thickness $D_1$ of the first phase shift film 102b and the film thickness $D_2$ of the second phase shift film 102a in which the NILS is improved than the comparative example should preferably fall within an area satisfying the following expressions:

$D_1(\text{nm}) > -0.5 \cdot D_2(\text{nm}) + 45 \text{ nm}$, and $D_1(\text{nm}) < -0.5 \cdot D_2(\text{nm}) + 75 \text{ nm}$.

Thereby, it can be said that from the viewpoint of transfer characteristics, $D_1$ and $D_2$ should fall within the range satisfying the above expressions.

The photomask blank according to the present invention and the photomask fabricated using the photomask blank have been described with reference to examples, but the above-described examples are mere examples for implementing the present invention, and the present invention is not limited to the illustrated examples.

Various modifications of these examples, such as adding an antireflection coating on the phase shift film 102, are within the scope of the present invention, and it is clear from the above descriptions that other various examples are possible within the scope of the present invention.

Lastly, the actual method for manufacturing the photomask 400 and the phase shift film 102 will be described. The phase shift film according to Examples 1 to 8 can be fabricated by making a deposition of the first phase shift film 102b on an optically-polished, six-inch-square synthetic quartz substrate having transmittance with a 0.25 in. film thickness, with using silicon as the target and with using nitrogen and argon as the sputtering gas, and making a deposition of the second phase shift film 102a with using silicon as the target and with using nitrogen, oxygen and argon as the sputtering gas, by a DC magnetron sputtering device.

Next, the light shielding film 101 is deposited on the phase shift film 102 by a DC magnetron sputtering device with using chromium as the target and with using nitrogen and oxygen as the sputtering gas. Thereby, a mask blank is fabricated. Further, a step for forming a pattern processing film on the light shielding film 101 for fabricating a mask blank as explained in FIG. 3 and the like can be added.

Next, an actual method for manufacturing the photomask 400 will be described.

The photomask blank 200 illustrated in FIG. 1 according to the first embodiment of the present invention was prepared. In the present example, the phase shift film 102 and the light shielding film 101 were set as follows.

The phase shift film 102 had a total film thickness of 70 nm and a transmittance of 30% and adopted a two-layer structure including the first phase shift film 102b with a film thickness of 48 nm and the second phase shift film 102a with a film thickness of 22 nm. The first phase shift film 102b is formed of silicon nitride, and the second phase shift film 102a is formed of silicon oxynitride.

The light shielding film 101 was a single-layer film having a film thickness of 70 nm, a chromium content of 50 atomic %, a carbon content of 20% and a nitrogen content of 30 atomic %, wherein the combination of the phase shift film 102 and the light shielding film 101 realized the transmittance of a wavelength of 193 nm is 0.1% or smaller.

A negative-type chemical amplification electron beam resist SEBN 2014 (manufactured by Shin-Etsu Chemical Co., Ltd.) was spin-coated to a film thickness of 150 nm on the photomask 200 to form the resist film 104, and the photomask blank 250 illustrated in FIG. 2 according to the second embodiment was realized (FIG. 6<S-1>).

Next, an evaluation pattern was drawn with a dosage of 35 µC/cm$^2$, and thereafter, heat treatment (PEB=Post Exposure Bake) was performed for ten minutes at 110° C. by a heat treatment device. Next, development was performed for 90 seconds by paddle development, and the first resist pattern 104a was formed (FIG. 6<S-2>).

Next, dry-etching was performed to the light shielding film 101 using oxygen-containing chlorine-based gas under the conditions described below (FIG. 6<S-3>). Etching penetration failure did not occur in this state.

<Dry-Etching Condition 1 of Light Shielding Film 101>
Apparatus: ICP (Inductively Coupled Plasma) method
Gas: $Cl_2+O_2+He$, Gas Pressure: 6 mTorr
ICP power: 400 W
Bias power: 15 W <Dry-Etching Condition 2 of Light Shielding Film 101>
Apparatus: ICP (Inductively Coupled Plasma) method
Gas: $Cl_2+O_2+He$, Gas Pressure: 6 mTorr
ICP power: 400 W
Bias power: 30 W Next, dry etching was performed to the phase shift film 102 using fluorine-based gas under the following conditions (FIG. 6<S-4>).

<Dry-Etching Condition of Phase Shift Film 102>
Apparatus: ICP
Gas: $SF_6+O_2$, Gas Pressure: 5 mTorr
ICP power: 325 W Next, the first resist pattern 104a was removed by sulfuric acid hydration cleaning (FIG. 6<S-5>).

Next, the resist film 104b was coated (FIG. 6<S-6>) and drawing was performed by a laser drawing device. Thereafter, development was performed to form the second resist pattern 104c (FIG. 6<S-7>).

Next, oxygen-containing chlorine-based gas was used to perform dry etching of the etching mask pattern 101a (FIG. 6<S-8>).

<Dry-Etching Condition 1 of Etching Mask Pattern 101a>
Apparatus: ICP (Inductively Coupled Plasma) method
Gas: $Cl_2+O_2+He$, Gas Pressure: 8 mTorr
ICP power: 500 W
Bias power: 10 W Next, the second resist pattern 104c was removed by sulfuric acid hydration cleaning, and the photomask 400 using the photomask blank according to the present invention was fabricated (FIG. 7<S-9>).

INDUSTRIAL APPLICABILITY

The photomask blank according to the present invention and the photomask manufacturing method using the same can be applied as a phase shift mask blank for fabricating a phase shift mask, and a method for manufacturing the phase shift mask, that has favorable wafer transfer characteristics (NILS, DOF, MEEF and EMF bias), irradiation resistance and pattern collapse resistance during cleaning in a latest photomask for a 14-nm or finer generation of logic devices or 20-nm or finer generation of memory devices.

REFERENCE SIGNS LIST

101: Light shielding film, 101a: etching mask pattern, 102: phase shift film, 102a: second phase shift film, 102b: first phase shift film, 102c: phase shift film pattern, 103: light-transmissive substrate, 104: resist film, 104a: first resist pattern, 104b: resist film, 104c: second resist pattern, 105: effective area, 106: periphery portion pattern, 107: pattern processing film, 107a: pattern processing pattern, 108: resist film, 108a: first resist pattern, 200, 250, 500, 550: photomask blank, 300: photomask, 400: photomask.

What is claimed is:

1. A photomask blank used for fabricating a photomask to which an exposure light with a wavelength of 193 nm is applied, the photomask blank comprising:
   a light-transmissive substrate;
   a phase shift film formed on the light-transmissive substrate and providing a phase shift effect; and
   a light shielding film formed on the phase shift film,
   wherein the phase shift film is composed by laminating
   a first phase shift film using a silicon nitride-based material, and
   a second phase shift film using a silicon oxynitride-based material,
   the phase shift film has a light transmittance of 30% or more with respect to the exposure light,
   the first phase shift film has a refractive index n1 of 2.5 or more and 2.75 or less, and the second phase shift film has a refractive index n2 of 1.55 or more and 2.20 or less,
   the first phase shift film has an extinction coefficient k1 of 0.2 or more and 0.4 or less, and the second phase shift film has an extinction coefficient k2 that is greater than 0 and no greater than 0.1, and
   a total film thickness of the phase shift film is greater than 70 nm and is 114 nm or less.

2. The photomask blank of claim 1,
   wherein the phase shift film is composed by laminating the second phase shift film on the first phase shift film that is formed on the light-transmissive substrate.

3. The photomask blank of claim 1,
   wherein in the phase shift film, a film thickness D1 of the first phase shift film and a film thickness D2 of the second phase shift film satisfies the following relationship:

$$D1(nm) > -0.5 \cdot D2(nm) + 45 \text{ nm, and}$$

$$D1(nm) < -0.5 \cdot D2(nm) + 75 \text{ nm.}$$

4. The photomask blank of claim 1,
   wherein the light shielding film is substantially not etched by fluorine-based dry etching and is capable of being etched by oxygen-containing chlorine-based dry etching, and has a chromium content of 20 atomic % or more.

5. A photomask to which an exposure light with a wavelength of 193 nm is applied, the photomask comprising:
   a light-transmissive substrate, and
   a circuit pattern which is a pattern formed on a phase shift film laminated on the light-transmissive substrate,
   wherein the phase shift film is composed by laminating
   a first phase shift film using a silicon nitride-based material, and a second phase shift film using a silicon oxynitride-based material, the phase shift film has a light transmittance of 30% or more with respect to the exposure light, the first phase shift film has a refractive index n1 of 2.5 or more and 2.75 or less, and the second phase shift film has a refractive index n2 of 1.55 or more and 2.20 or less, the first phase shift film has an extinction coefficient k1 of 0.2 or more and 0.4 or less, and the second phase shift film has an extinction coefficient k2 that is greater than 0 and no greater than 0.1, and a total film thickness of the phase shift film is greater than 70 nm and is 114 nm or less.

6. The photomask of claim 5, wherein the phase shift film is composed by forming the first phase shift film on the light-transmissive substrate, and further laminating the second phase shift film on the first phase shift film.

7. The photomask of claim 5, wherein in the phase shift film, a film thickness D1 of the first phase shift film and a film thickness D2 of the second phase shift film satisfies the following relationship:

$$D1(nm) > -0.5 \cdot D2(nm) + 45 \text{ nm, and}$$

$$D1(nm) < -0.5 \cdot D2(nm) + 75 \text{ nm.}$$

8. The photomask of claim 5, wherein the photomask comprises a light shielding film laminated on the phase shift film positioned at a periphery portion of an effective area including the circuit pattern, and, the light shielding film is substantially not etched by fluorine-based dry etching and is capable of being etched by oxygen-containing chlorine-based dry etching, and has a chromium content of 20 atomic % or more.

9. The photomask of claim 8, wherein a light transmittance to the exposure light of a laminated film combining with the light shielding film and the phase shift film provided on the periphery portion is 0.1% or less.

10. A photomask manufacturing method using the photomask blank of claim 1, comprising:

forming a pattern on the light shielding film by performing dry etching using an oxygen-containing chlorine-based gas to the light shielding film;

forming a circuit pattern and a periphery portion pattern that forms a periphery portion of an area including the circuit pattern on the phase shift film, by performing dry etching using a fluorine-based gas to the phase shift film using the pattern formed on the light shielding film as a mask;

forming a resist pattern on the periphery portion pattern, and performing dry etching using an oxygen-containing chlorine-based gas using the resist pattern as a mask to remove a portion of the light shielding film; and removing the resist pattern.

* * * * *